(12) United States Patent
Tiemeijer

(10) Patent No.: US 7,928,517 B2
(45) Date of Patent: Apr. 19, 2011

(54) HIGH FREQUENCY TRANSISTOR LAYOUT FOR LOW SOURCE DRAIN CAPACITANCE

(75) Inventor: Lukas Frederik Tiemeijer, Eindhoven (NL)

(73) Assignee: NXP B.V., Eindhoven (NL)

( * ) Notice: Subject to any disclaimer, the term of this patent is extended or adjusted under 35 U.S.C. 154(b) by 300 days.

(21) Appl. No.: 11/630,855

(22) PCT Filed: Jun. 22, 2005

(86) PCT No.: PCT/IB2005/052050
§ 371 (c)(1),
(2), (4) Date: Dec. 22, 2006

(87) PCT Pub. No.: WO2006/000993
PCT Pub. Date: Jan. 5, 2006

(65) Prior Publication Data
US 2007/0187780 A1 Aug. 16, 2007

(30) Foreign Application Priority Data

Jun. 24, 2004 (EP) .................................. 04102947

(51) Int. Cl.
*H01L 27/088* (2006.01)
(52) U.S. Cl. .... 257/401; 257/341; 257/342; 257/E29.12
(58) Field of Classification Search ................. 257/401, 257/E29.12, 342, 728, 767, 593, E23.015
See application file for complete search history.

(56) References Cited

U.S. PATENT DOCUMENTS

| 5,672,894 | A  | * | 9/1997  | Maeda et al. ................ 257/343 |
| 6,140,687 | A  |   | 10/2000 | Shimomura |
| 6,274,896 | B1 | * | 8/2001  | Gibson et al. ................ 257/259 |
| 6,376,866 | B1 |   | 4/2002  | Shakuda |
| 6,566,185 | B2 |   | 5/2003  | Inoue |
| 2001/0048832 | A1 | * | 12/2001 | Kaplan .......................... 400/76 |

FOREIGN PATENT DOCUMENTS

JP        02-268467 A    2/1990

OTHER PUBLICATIONS

Tiemeijer, L.F et al. A Record Hight 150 GHz Fmas Realized at 0.18um Gate Length in an Industrial RF-CMOS Technology. Philips Research Laboratories. Prof. Holstlaan 4, 5656 AA Eindhoven, The Netherlands.

* cited by examiner

*Primary Examiner* — Lynne A Gurley
*Assistant Examiner* — Jesse Y Miyoshi

(57) ABSTRACT

An RF field effect transistor has a gate electrode, and comb shaped drain and source electrodes, fingers of the comb shaped drain being arranged to be interleaved with fingers of the source electrode, the source and drain electrodes having multiple layers (110,120,130,140). An amount of the interleaving is different in each layer, to enable optimization, particularly for low parasitic capacitance without losing all the advantage of low current density provided by the multiple layers. The interleaving is reduced for layers further from the gate electrode by having shorter fingers. The reduction in interleaving can be optimized for minimum capacitance, by a steeper reduction in interleaving, or for minimum lateral current densities in source and drain fingers, by a more gradual reduction in interleaving. This can enable operation at higher temperatures or at higher input bias currents, while still meeting the requirements of electro-migration rules.

19 Claims, 4 Drawing Sheets

FIG. 12 Minimal Electromigration

FIG. 11 Minimal Capacitance

HIGH FREQUENCY TRANSISTOR LAYOUT FOR LOW SOURCE DRAIN CAPACITANCE

This invention relates to high frequency transistors, and to integrated circuits comprising such transistors.

High frequency transistors for switching RF signals at GHz frequencies are known. BiCMOS processes have shown promise for the highest frequency operation, but RF-CMOS can be more suitable for single chip system solutions. CMOS processes are mainly used for digital applications. If, however, high frequency analog circuits also can be integrated in the same process, this offers advantages as then only one process and one chip is required for many applications. The high frequency behaviour of standard CMOS transistors, e.g. for digital circuits may be considerably increased by optimising the layout for these high frequencies. Such applications can include communication equipment, such as mobile radio communication base stations, satellite communication equipment, mobile consumer wireless devices, and all applications where frequencies in the GHz range are used, especially in the front-ends of telecommunication, radio or other RF systems (GSM, DCS, UMTS, Hiperlan, etc). For mobile devices, high levels of integration, and low power consumption are sought. Efforts to optimize the high frequency operation of RF-CMOS and other devices are described in the following.

U.S. Pat. Nos. 6,140,687 and 6,566,185, among others, disclose that a drain and source layout in the form of a comb or finger structure is advantageous for high frequency properties of a MOSFET, i.e. to decrease the gate resistance. In U.S. Pat. No. 6,140,687 it is explained that conventionally, GaAs ICs, silicon bipolar ICs and BiCMOS LSIs are mainly used as devices for switching or amplifying high frequency analog signals. However FETs and in particular MOSFETs are preferred where low cost and low power consumption are desired in one-chip analog/digital ICs combining both analog and digital circuitry. MOSFETs have the following advantages as compared with bipolar transistors (hereinafter referred to as BJT):
(1) High integration
(2) Low distortion characteristic
(3) High gain and high efficiency However, when a MOSFET is used as a device for a high frequency analog signal, the MOSFET is less advantageous in several characteristics:
(1) low transconductance ($g_m$), and therefore low gain. When the current $I_d$ is constant, it is necessary to increase W/L, namely, a ratio between the gate width and the gate length, in order to increase a transconductance $g_m$.
(2) Lower cut-off frequency $f_T$. The frequency $f_T$ is the frequency at which the current gain becomes 1, and is proportional to transconductance $g_m$, and inversely proportional to a sum of a gate-source capacitance $C_{gs}$ and a gate-drain capacitance $C_{gd}$. Accordingly, a cut-off frequency $f_T$ can be improved simply by decreasing a gate length L.
(3) noise: lower in a transistor having a larger transconductance $g_m$ and smaller gate resistance $R_g$ and source resistance $R_s$.
(4) maximum oscillation frequency $f_{max}$. The frequency $f_{max}$ is a frequency at which the power gain becomes 1, and is higher as a gate resistance $R_g$ and a source resistance $R_s$ are smaller and as a source inductance $L_s$ is smaller. Therefore, in a MOSFET disposed in a conventional high frequency IC, a finger-shaped gate electrode structure is adopted for improving these high frequency characteristics.

An improvement using a ring gate electrode is proposed in U.S. Pat. No. 6,140,687. In U.S. Pat. No. 6,566,185, there is shown a FET power transistor to amplify ultra high frequencies, with a so-called multi-finger structure each of which is constituted by an interdigitated electrode, and a unit prepared by arranging a plurality of unit cells each made up of a drain, gate, and source to be adjacent to each other.

To obtain a large output, the finger length and the number of finger electrodes are increased, thereby increasing the gate width of the whole element. However, a long gate finger increases the gate resistance and degrades high-frequency characteristics.

It is also known from a paper published at the IEDM December 2001, "A record high 150 Ghz $f_{max}$ realized at 0.18 µm gate length in an industrial RF-CMOS technology", by Tiemeijer et al, that an optimized layout can reduce gate resistance to increase $f_{max}$ while keeping RF and substrate noise low. The layout includes a folded structure, a shared drain, and a p+ guard ring.

It is also known from U.S. Pat. No. 6,376,866 that a FET can have comb shaped source and drain electrodes to reduce an ON resistance. It explains that if the combs are formed facing each other close together so that their teeth are interleaved, then the opposing surface area increases and the parasitic capacitance between these electrodes increases, which decreases the maximum frequency of operation. To address this, it is suggested to keep the comb shaped electrodes apart so that their teeth do not interleave.

It is shown in US patent application 2002/0140089 that multiple layers of wiring can be used for power supply lines in a semiconductor IC, to reduce current density and therefore electromigration.

An object of the invention is to provide improved apparatus or methods. According to a first aspect, the invention provides a field effect transistor having a gate electrode, and comb shaped drain and source electrodes, fingers of the comb shaped drain electrode being arranged to be interleaved with fingers of the source electrode, the source and drain electrodes having multiple layers, an amount of the interleaving being different in different ones of the multiple layers. The drain is interdigitated with the source electrode.

This can provide an improved layout for a high frequency MOSFET. As well as low gate resistance, there are still two other, conflicting aspects to the layout, to enable higher frequency operation, which can be addressed by the invention. Parasitic capacitance at in- and output must be kept as low as possible, so the layout should use minimum design rules as much as possible. On the other hand, the current carrying connections to source and drain should not be made too small as in that case the current densities become too high. This might cause a breach of electro-migration design rules.

In the improved layout according to the invention, the multiple layers are not identical, but can be optimized to better meet the conflicting demand of low parasitic capacitance without losing all the advantage of low current density provided by the multiple layers.

An additional feature for a dependent claim is the interleaving being reduced for layers further from the gate electrode. This is one way of helping optimize the layout to reduce parasitic capacitance without losing too much of the low current density advantage.

An additional feature for a dependent claim is having shorter fingers in the layers further from the gate electrode. This can help reduce inductance and current density further.

Another additional feature is one or more of the layers having no interleaving. This can help enable reduced parasitic capacitance.

Another additional feature is the interleaving of the layer closest to the gate electrode extending across substantially the entire gate. This can help reduce ON resistance.

Another additional feature is a spine of the comb shape of the drain or source electrode extending over part of the gate electrode for layers where the interleaving is reduced. Again this can help reduce capacitance and current density.

Another additional feature is the gate electrode having a comb shape. This can help reduce gate resistance and parasitic capacitances.

Another such additional feature is the gate electrode being double sided.

For each metal layer, an optimal layout can be used, such that each additional metal layer the length of the fingers becomes smaller and smaller. The reduction in interleaving can be arranged in a number of ways based on:
1) Optimisation for minimum capacitance, by a steeper reduction in interleaving, and
2) Optimisation for minimum lateral current densities in source and drain fingers, by a more gradual reduction in interleaving. This can enable operation at higher temperatures or at higher input bias currents, while still meeting the requirements of electro-migration rules.

Other aspects of the invention include integrated circuits or mobile wireless devices comprising the transistor, and methods of making such transistors or integrated circuits.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

How the present invention may be put into effect will now be described by way of example with reference to the appended drawings, in which:

FIGS. 11 and 12 show corresponding cross sections for embodiments of the invention.

Figure 1:
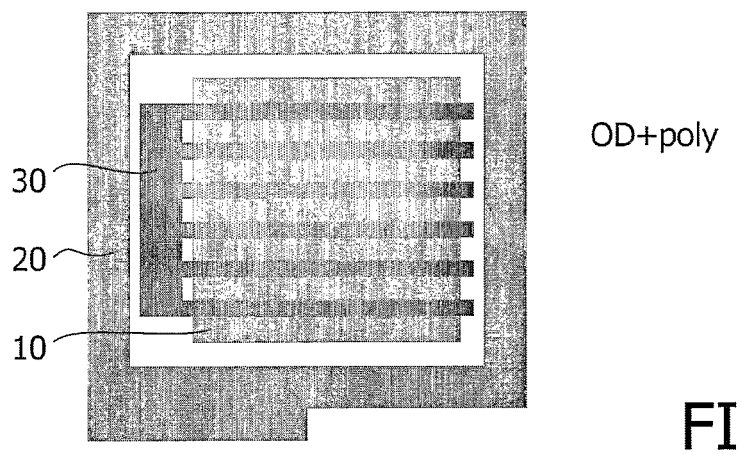
FIGS. 1 to 3 show stages in making a known device having a single sided gate

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

By way of introduction to the embodiments, for reference, FIGS. 1 to 6 show schematic plan views for showing exemplified layouts of a known MOSFET having comb shaped gate electrodes and comb shaped source and drain electrodes, to which the invention can be applied. Specifically, as shown in FIG. 1, OD and poly steps are carried out to form an active area 10 of a substrate, surrounded by an isolation ring 20, and a comb shaped gate electrode 30 located over the active area. The active areas at the sides of each finger of the gate electrode can function as a source region or a drain region.

Figure 2:
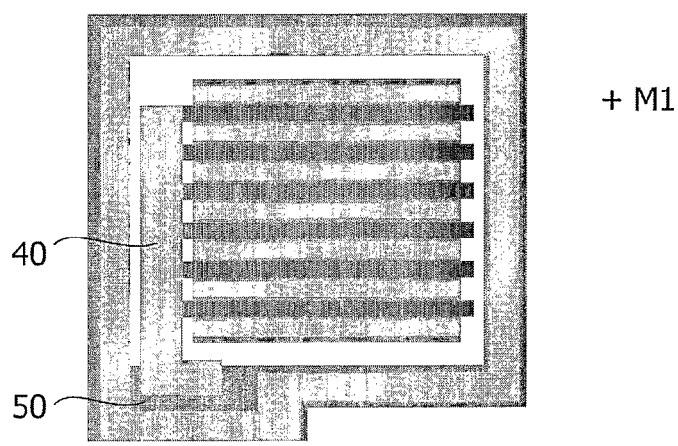
Figure 3:
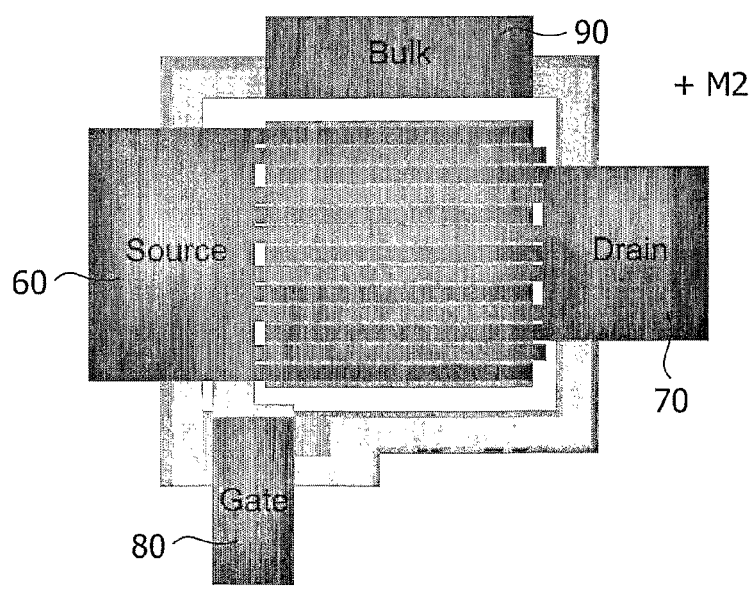

FIG. 2 shows a first conductive layer M1, e.g. metal layer, added to provide electrodes 40, 50 for connections to the gate and the isolation ring or the bulk of the substrate respectively. As is shown in FIG. 3, over each of these source regions and drain regions, a second conductive layer M2, e.g. metal layer, forms fingers of comb shaped source (60) and drain (70) electrodes. The fingers interleave, and on each side of a gate finger there is a drain and a source finger. The use of multiple fingers serves to decrease gate resistance, source resistance $R_s$ and drain resistance $R_d$. The same layer can provide contacts to the gate and bulk parts. To be able to meet the requirements of electro-migration, it is often necessary to make the connections as illustrated by the second metal layer M2 in 3 to 4 parallel metal layers which are conventionally identical in layout.

Figure 4:
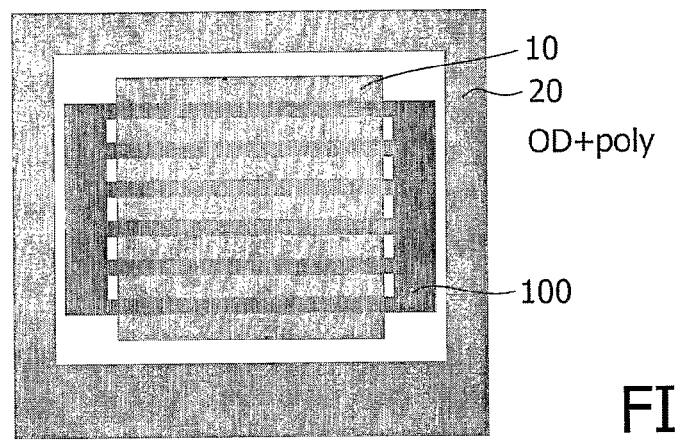
FIGS. 4 to 6 show stages in making a known device having a double sided gate
Figure 5:
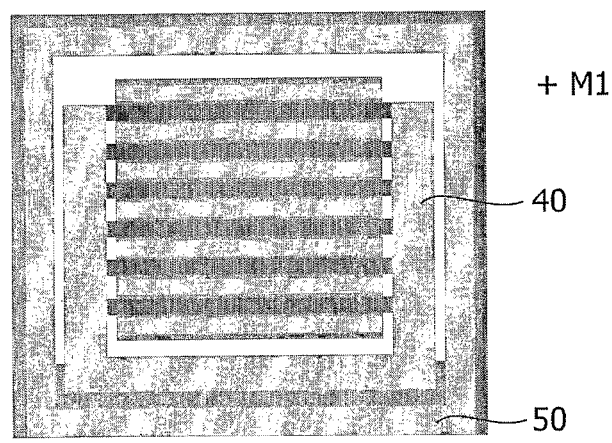
Figure 6:
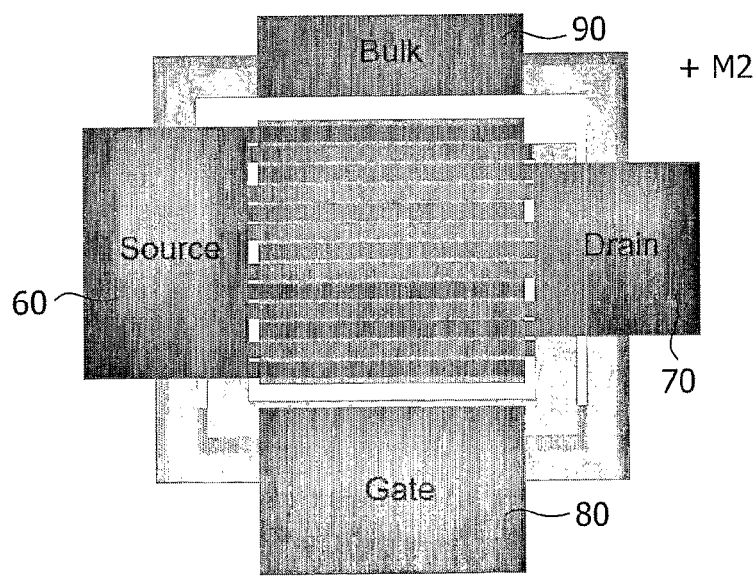

FIGS. 4 to 6 show a similar arrangement, plan views which differ in that the gate electrode (100) is double sided. This means contact portions are provided at both ends of each gate electrode finger so as to decrease further an equivalent gate resistance $R_g$.

As a finger length of a gate electrode in each unit cell of the transistor is increased, the minimum noise Figure $NF_{min}$ is increased. Therefore, in a MOSFET having a layout with more fingers but shorter fingers, it is feasible to retain the total gate width constant, and decrease the minimum noise Figure $NF_{min}$ by increasing the number of fingers.

Figure 7:
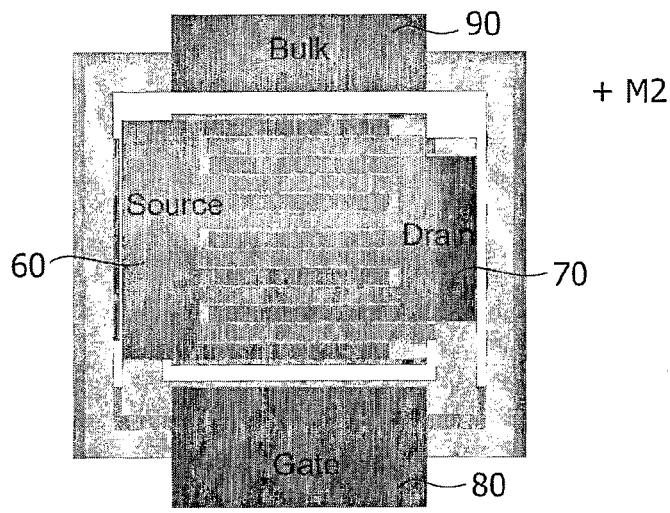
FIGS. 7 to 9 show stages in making a device according to an embodiment of the invention.
Figure 8:
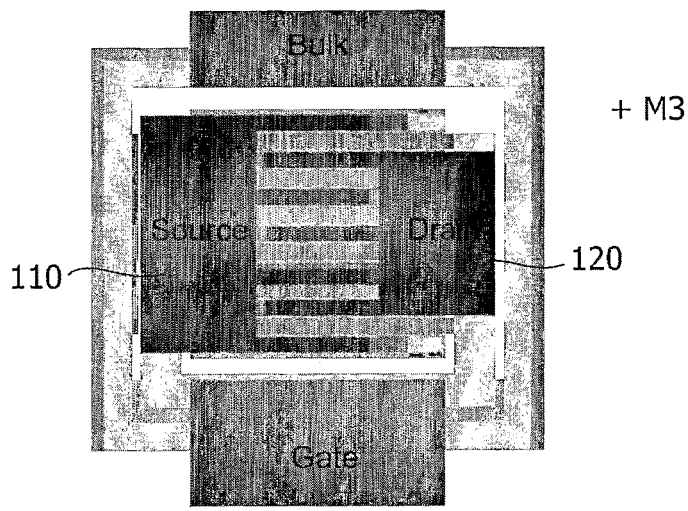
Figure 9:
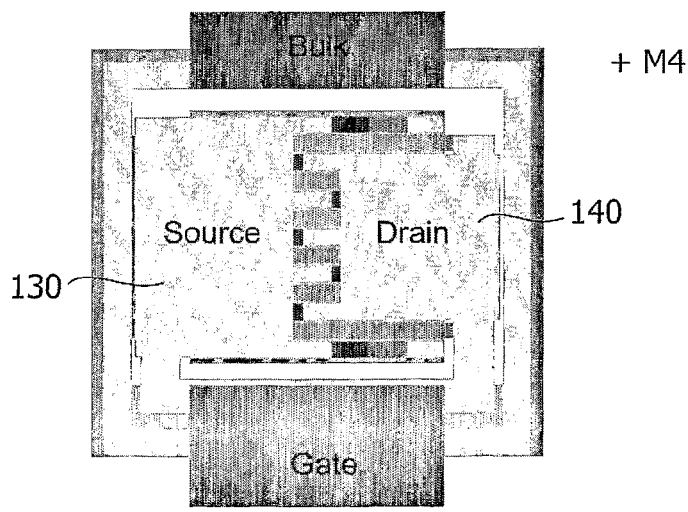

A first embodiment of the invention, illustrated in FIGS. 7 to 9 shows an example of how conductive, e.g. metal layers M3 and M4 can differ from M2. Corresponding reference numerals to those of FIGS. 1 to 6 have been used as appropriate. FIG. 7 corresponds closely to FIG. 6.

In FIG. 8, a third conductive, e.g. metal layer M3 is laid to provide multiple layered source and drain electrodes (110, 120). This layer differs from M2 in that the fingers of the electrodes are shorter, and the spine of the comb shape is wider, so that the amount of interleaving is reduced. There are other ways of achieving the reduction of interleaving. The widened spine of the combs extends over part of the gate electrodes and part of the area of interleaving of layer M2.

In FIG. 9, a further conductive, e.g. metal layer M4 is shown further from the gate electrode and with yet further reduction in an amount of interleaving of the fingers of the source and drain electrodes (130,140). Again, the spines of the combs are widened and the fingers shortened so that the spines cover more of the gate electrode fingers. There can be further layers. For each additional conductive, e.g. metal layer the length of the fingers becomes smaller and smaller. This arrangement is an optimisation for minimum lateral current density in source and drain fingers. At high temperatures and at high input bias currents the transistor can still meet the requirements of electro-migration rules.

Figure 10:
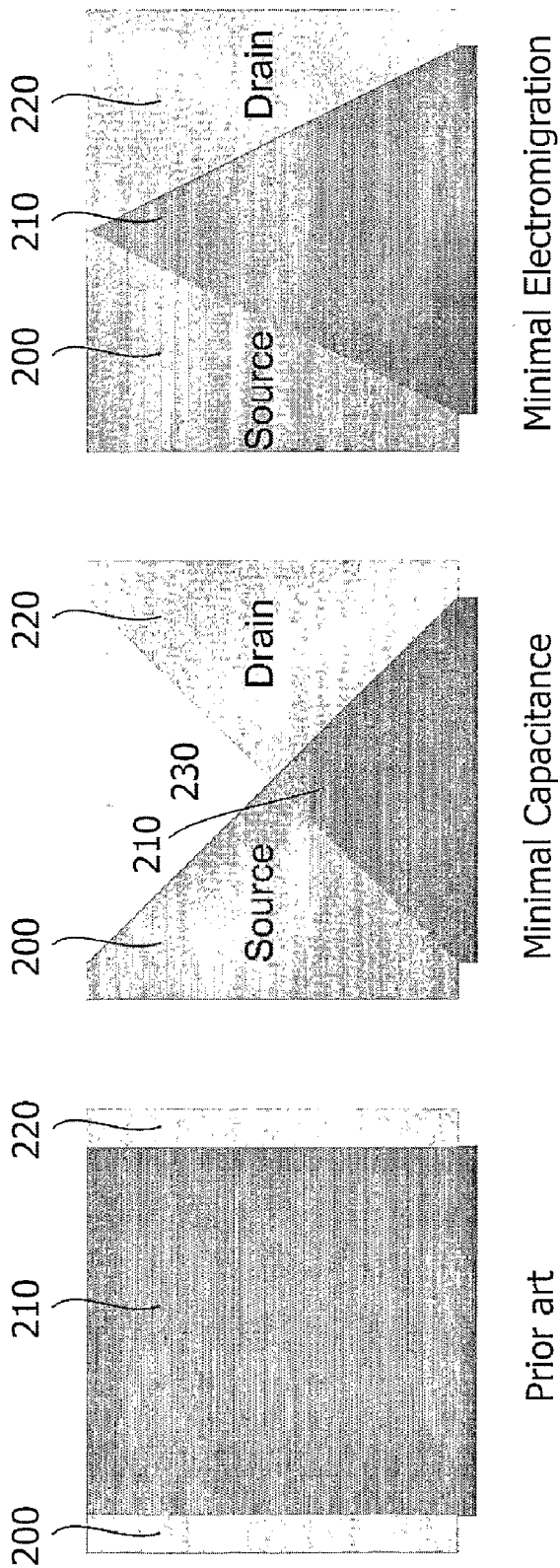
FIG. 10 shows a cross section in schematic form to represent the amount of interleaving of source and drain of a known device.

In FIGS. 10 to 12 a summary of this and another possible arrangement are shown schematically in cross-sections of the layouts. Although not shown, a gate would be at the bottom of each of these Figures. Multiple layers away from the gate are represented by a single block extending in a vertical direction. Block 200 represents a multiple layered source electrode. Block 220 represents a multiple layered drain electrode. Block 210 represents an area of interleaving of fingers of the comb shapes. In FIG. 10 it can be seen that the layers and the area of interleaving do not change for layers further from the gate. In FIG. 11 it can be seen that the layers and the area of interleaving do change for layers further from the gate. The area of interleaving is the size of the gate electrode at the layer nearest the gate electrode. This area is reduced to zero at an intermediate layer. Higher layers further from the gate electrode have zero interleave and have a gap 230 between source and drain which increases for higher layers. This arrangement is an optimisation for minimum capacitance between source and drain fingers. A reduction of about a factor 4 with respect to the prior art is achievable.

FIG. 12 shows a similar cross section of an embodiment which corresponds to FIGS. 7 to 9 and represents an optimisation for minimum lateral current density. This can lead to a benefit of about a factor 2 in lateral current density with respect to the prior art and at the same time a factor 2 reduction in capacitance between source and drain fingers can be achieved. In this case the reduction of interleave is more gradual, reaching zero at the layer furthest from the gate electrode.

The transistor according to embodiments of the present invention can be implemented using for example CMOS technology. In a 90 nm CMOS technology with a low-k copper backend (e.g. BCB with $\epsilon_r=2.9$ and a dual Damascene Cu process) the electromigration design rules are complied with by choosing the source and the drain interconnect wider than the minimum design rule and by realizing the source and drain interconnect in the metal levels 2, 3 and 4. So to be able to meet the requirements of electro-migration, the source and drain connections use four parallel metal layers. This leads to the fact that almost all available metal layers have to be used for source and drain connections. The parasitic capacitances between source and drain fingers are kept as low as possible by reducing the amount of interleaving for the metal layers further from the gate electrode.

N-MOS devices designed in this way have a nominal cut-off frequency $f_T$ as high as 150 GHz. The n-MOS transistors can be used to realize a highly integrated mixed mode RF/Analog/Digital system on a chip (SOC). The optimised layouts enables improvements in power gain for the n-MOS transistor.

The transistor can be an n-MOS transistor having a triple-well n-MOS unit cell. Each unit cell can contain a number of parallel gate fingers contacted from both sides and is surrounded by a ring of well contacts. To comply with the electromigration design rules the source and drain interconnect can be made wider than the minimum design rule and realized in different metal levels. To achieve a desired drive current level several unit cells can be placed in parallel.

To conclude, as has been described above, an RF field effect transistor has a gate electrode, and comb shaped drain and source electrodes, fingers of the comb shaped drain being arranged to be interleaved with fingers of the source electrode, the source and drain electrodes having multiple layers (110,120,130,140). An amount of the interleaving can be different in each layer, to enable optimization, particularly for low parasitic capacitance without losing all the advantage of low current density provided by the multiple layers. The interleaving is reduced for layers further from the gate electrode by having shorter fingers. The reduction in interleaving can be optimised for minimum capacitance, by a steeper reduction in interleaving, or for minimum lateral current densities in source and drain fingers, by a more gradual reduction in interleaving. This can enable operation at higher temperatures or at higher input bias currents, while still meeting the requirements of electro-migration rules.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A field effect transistor having a gate electrode, a comb shaped drain electrode having multiple comb shaped layers and a comb shaped source electrode having multiple comb shaped layers, fingers of each of the multiple comb shaped layers of the comb shaped drain electrode being arranged to be interleaved with fingers of a respective one of the multiple comb shaped layers of the comb shaped source electrode, the fingers of all layers of the comb shaped source electrode extending in substantially the same direction and the fingers of all layers of the comb shaped drain electrode extending in substantially the same direction, an amount of the interleaving between the fingers of the comb shaped source electrode and comb shaped drain electrode being different between different layers of the multiple comb shaped layers of the comb shaped source electrode and comb shaped drain electrode.

2. The transistor of claim 1, wherein the interleaving between the fingers of the comb shaped source electrode and comb shaped drain electrode is reduced for layers of the comb shaped source electrode and comb shaped drain electrode that are further from the gate electrode relative to other layers of the comb shaped source electrode and comb shaped drain electrode.

3. The transistor of claim 1 wherein the comb shaped source electrode and comb shaped drain electrode have shorter fingers in layers that are further from the gate electrode, relative to the length of the fingers in layers of the comb shaped source electrode and comb shaped drain electrode that are closer to the gate electrode.

4. The transistor of claim 1, wherein the comb shaped source electrode includes one or more layers having no interleaving with a layer of the comb shaped drain electrode.

5. The transistor of claim 1, wherein the interleaving between the fingers of the layer of the comb shaped drain electrode and the fingers of the layer of the comb shaped source electrode closest to the gate electrode extend across substantially the entire gate electrode.

6. The transistor of claim 2, wherein the layers of the comb shaped source electrode and comb shaped drain electrode having reduced interleaving, relative to other layers of the comb shaped source electrode and comb shaped drain electrode, have a spine of the comb shape of the drain electrode or source electrode extending over part of the gate electrode.

7. The transistor of claim 1, the gate electrode having a comb shape.

8. The transistor of claim 1, the gate electrode being double sided.

9. An integrated circuit having the transistor of claim 1.

10. A wireless device comprising the integrated circuit of claim 9.

11. The transistor of claim 1, wherein each of the fingers of a first one of the layers of the comb shaped source electrode have a first length, each of the fingers of a second one of the layers of the comb shaped source electrode have a second length that is different from the first length, each of the fingers of a first one of the layers of the comb shaped drain electrode have the first length, and each of the fingers of a second one of the layers of the comb shaped drain electrode have the second length.

12. The transistor of claim 1, wherein each of the multiple layers of the comb shaped source electrode and comb shaped drain electrode are on a common side of the gate electrode.

13. The transistor of claim 1, wherein the layers of the comb shaped source electrode each include a spine having fingers extending perpendicularly therefrom, with at least one of the layers of the comb shaped source electrode having a spine that is different in thickness relative to the thickness of a spine in another one of the layers of the comb shaped source electrode, and the layers of the comb shaped drain electrode each include a spine having fingers extending perpendicularly therefrom, with at least one of the layers of the comb shaped drain electrode having a spine that is different in thickness relative to the thickness of a spine in another one of the layers of the comb shaped drain electrode.

14. The transistor of claim 1, wherein the layers of the comb shaped source electrode each include a spine having fingers extending therefrom, each layer of the comb shaped source electrode being stacked vertically relative to one another, and the layers of the comb shaped drain electrode each include a spine having fingers extending therefrom, each layer of the comb shaped drain electrode being stacked vertically relative to one another.

15. An integrated circuit transistor device comprising:
a gate electrode;
a stacked multiple-layer comb-shaped source electrode, all layers of the comb shaped source electrode having a spine and a plurality of fingers extending from the spine in a horizontal direction, the fingers of all layers of the comb shaped source electrode extending in substantially the same direction, and all layers of the comb shaped source electrode being arranged vertically relative to the other layers of the comb shaped source electrode; and
a stacked multiple-layer comb-shaped drain electrode, all layers of the comb shaped drain electrode having a spine and a plurality of fingers extending from the spine in a horizontal direction, all layers of the comb shaped drain electrode being arranged vertically relative to the other layers in the drain;
the fingers of each of the layers of the comb shaped drain electrode being interleaved with fingers of a respective one of the layers of the comb shaped source electrode, the interleaving between the fingers of the layers of the comb shaped source electrode and comb shaped drain electrode being relatively reduced for layers of the comb shaped source electrode and comb shaped drain electrode that are farther from the gate electrode, relative to the interleaving between the fingers of the layers of the comb shaped source electrode and comb shaped drain electrode of other layers of the comb shaped source electrode and comb shaped drain electrode that are closer to the gate electrode.

16. The device of claim 15, wherein
each of the layers of the comb shaped source electrode has a spine that is of a different thickness, relative to the other layers of the comb shaped source electrode, and
each of the layers of the comb shaped drain electrode has a spine that is of a different thickness, relative to the other layers of the comb shaped drain electrode.

17. The device of claim 15, wherein each of the fingers in the comb shaped source electrode and each of the fingers in the comb shaped drain electrode are on a common side of the gate electrode.

18. The device of claim 15, wherein the gate electrode is comb shaped.

19. The device of claim 15, wherein each of the fingers of a first one of the layers of the comb shaped source electrode have a first length, each of the fingers of a second one of the layers of the comb shaped source electrode have a second length that is different from the first length, each of the fingers of a third one of the layers of the comb shaped source electrode have a third length that is different from the second length, each of the fingers of a first one of the layers of the comb shaped drain electrode have the first length, each of the fingers of a second one of the layers of the comb shaped drain electrode have the second length, and each of the fingers of a third one of the layers of the comb shaped drain electrode have a third length.

* * * * *